United States Patent [19]

Hu et al.

[11] Patent Number: 5,952,115

[45] Date of Patent: Sep. 14, 1999

[54] ELECTROLUMINESCENT DEVICES

[75] Inventors: Nan-Xing Hu, Oakville; Shuang Xie, Mississauga; Zoran D. Popovic, Mississauga; Beng S. Ong, Mississauga; Ah-Mee Hor, Mississauga, all of Canada

[73] Assignee: Xerox Corporation, Stamford, Conn.

[21] Appl. No.: 08/942,882

[22] Filed: Oct. 2, 1997

[51] Int. Cl.[6] .................................. H05B 33/18
[52] U.S. Cl. ..................... 428/690; 313/504; 428/216; 428/917; 548/416; 548/418
[58] Field of Search ................... 548/416, 418; 428/690, 917, 216; 313/504

[56] References Cited

U.S. PATENT DOCUMENTS

| | | | |
|---|---|---|---|
| 3,172,862 | 3/1965 | Gurnee et al. | 252/301.3 |
| 3,530,325 | 9/1970 | Mehl et al. | 313/108 |
| 4,356,429 | 10/1982 | Tang | 313/503 |
| 4,539,507 | 9/1985 | VanSlyke et al. | 313/504 |
| 4,885,211 | 12/1989 | Tang et al. | 428/457 |
| 5,150,006 | 9/1992 | Van Slyke et al. | 313/504 |
| 5,151,629 | 9/1992 | VanSlyke | 313/504 |
| 5,487,953 | 1/1996 | Shirota et al. | 428/690 |
| 5,516,577 | 5/1996 | Matsuura et al. | 428/212 |
| 5,554,450 | 9/1996 | Shi et al. | 428/690 |

*Primary Examiner*—Ellis Robinson
*Assistant Examiner*—George H. Weeks
*Attorney, Agent, or Firm*—E. O. Palazzo

[57] ABSTRACT

An organic electroluminescent (EL) device with a charge transport component of an indolocarbazole compound represented by Formulas (I) or (II)

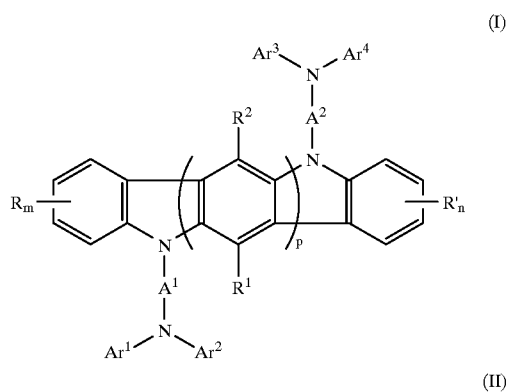

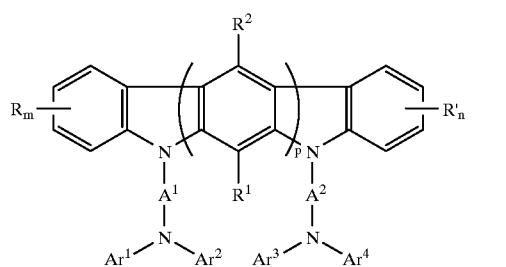

wherein R and R' are independently selected from the group consisting of hydrogen, alkyl, alkoxyl, aryl, and halogen; m and n are numbers from 0 to 4; $A^1$ and $A^2$ are arylene; $Ar^1$, $Ar^2$, $Ar^3$, and $Ar^4$ are aryl; $R^1$ and $R^2$ are independently selected from the group consisting of hydrogen, alkyl, alkoxyl, aryl, and halogen; and p is a number from 1 to 3.

24 Claims, 1 Drawing Sheet

ELECTROLUMINESCENT DEVICES

PENDING APPLICATIONS

Illustrated in copending applications U.S. Ser. No. 08/942,647, U.S. Ser. No. 08/942,598, and U.S. Pat. No. 5,843,607, filed concurrently herewith, are EL devices. The disclosures of each of these applications are totally incorporated herein by reference.

Also, illustrated in copending applications U.S. Pat. No. 5,763,110, U.S. Ser. No. 08/707,260, U.S. Pat. No. 5,846,666, U.S. Ser. No. 807,489, U.S. Pat. No. 5,891,587 and U.S. Ser. No. 08/829,398, the disclosures of each being totally incorporated herein by reference, are EL devices.

A number of the EL components of the copending applications, such as the anode, cathode, electron injectors, electron transports, and the like, can be selected for the EL devices of the present invention in embodiments thereof.

BACKGROUND OF THE INVENTION

This invention is generally directed to electroluminescent (EL) devices, and more specifically, to organic EL devices with enhanced thermal and operational stability, and thus improved device durability, and which devices contain indolocarbazoles as the charge, and especially hole transport components.

There has been substantial interest with regard to developing an energy-efficient flat-panel display based on organic EL devices, primarily because of their potential as an emissive display technology which may offer unrestricted viewing angles and high luminescence output at low operating voltages. However, despite the recent advances that have been made in EL device design and fabrication, a number of the current EL device performances does not usually effectively satisfy the requirements for practical applications. Examples of undesirable performance characteristics include short serviceable life, high operating voltages, and low EL efficiency, and the rectification of all these performance deficiencies represents one formidable challenge in EL device research and development. Accordingly, one of the features of the present invention is to provide organic EL devices which provide for long device life span and excellent EL efficiency.

PRIOR ART

Prior art organic EL devices have been prepared from a laminate comprised of an organic luminescent material and electrodes of opposite polarity, and which devices can include a single crystal material, such as single crystal anthracene, as the luminescent substance as described, for example, in U.S. Pat. No. 3,530,325. These devices, however, usually require excitation voltages on the order of about 100 volts or greater. More recently, organic EL devices comprised of multi-layered thin films of organic materials have been disclosed. Illustrative examples of this type of EL devices have been disclosed in publications by Tang et al. in *J. Appl. Phys.*, vol. 65, pp. 3610 to 3616 (1989), and Saito et al. in *Mol. Cryst. Liq. Cryst.*, vol. 253, pp. 125 to 132 (1994), the disclosures of which are totally incorporated herein by reference.

An organic dual layered EL device is generally comprised of one hole transport layer adjacent to the anode supporting hole injection and transport, and an electron transport layer adjacent to the cathode supporting electron injection and transport. The recombination of charge carriers and subsequent emission of light occurs in one of these layers near their interface. Optionally, a fluorescent material which is capable of emitting light in response to electron-hole recombination can be added to one of the layers. In another configuration, an EL device can be comprised of three separate layers, a hole transport layer, an emission layer, and an electron transport layer, which are laminated in sequence and are sandwiched as a whole between an anode and a cathode.

Specifically, U.S. Pat. No. 4,356,429 discloses an EL device formed of an organic luminescent medium consisting of a hole transporting layer and an electron transporting layer, wherein the hole transporting layer is comprised of a porphyrinic compound. Further, in U.S. Pat. No. 4,539,507 there can be selected an aromatic tertiary amine layer for the hole transporting porphyrinic layer. Illustrative examples of the aromatic tertiary amine compounds disclosed are triphenylamines, such as N,N,N-triphenylamine and N,N,N-tri-p-tolylamine, those containing at least two aromatic tertiary amine moieties, such as 1,1-bis(4-ditolylaminophenyl)cyclohexane, and tetraaryldiamines, such as N,N'-bis(3-methylphenyl)-N,N'-diphenyl-4,4'-diaminobiphenyl, N,N,N',N'-tetra-p-tolyl-4,4'-diaminobiphenyl.

While hole transport materials comprised of the above-mentioned aromatic tertiary amines are generally known to facilitate hole injection and hole transport processes, the thermal and morphological instabilities of these materials result in poor EL performance and short operational life. EL devices with triphenylamine-based aromatic amines are disclosed in U.S. Pat. Nos. 5,487,953 and 5,554,450.

There is thus a need for hole transport materials which are readily accessible synthetically, and which can be prepared in excellent yields and with excellent electronic purity. Another need resides in the provision of new hole transport materials which are capable of forming thermally and morphologically stable thin films by vacuum deposition techniques. A still further need is for the preparation of new hole transport materials suitable for organic EL device applications, and which materials possess excellent hole transport characteristics enabling the EL devices to operate at low voltages of, for example, below 20 volts. These and other needs are achievable in embodiments of the present invention.

FIGURES

Illustrated in FIGS. 1 and 2 are EL devices of the present invention.

SUMMARY OF THE INVENTION

It is a feature of the present invention is to provide organic EL devices with many of the advantages illustrated herein.

Another feature of the present invention is to provide organic EL devices with enhanced thermal stability and operational stability.

A further feature of the present invention relates to the provision of novel performance enabling charge, especially hole transport compounds for organic EL device applications.

In another feature of the present invention there are provided improved EL devices which exhibit high electroluminescence efficiency at relatively low operating voltages of, for example, below about 25 volts, such as from about 5 to about 20 volts.

In yet in another feature of the present invention there are provided improved EL devices comprised of an anode, a cathode, and an organic electroluminescent element sandwiched in between the anode and the cathode, and wherein the organic electroluminescent element is comprised of at least one layer containing an indolocarbazole hole transport component.

An associated feature of the present invention is the provision of EL devices with indolocarbazole compounds which possess excellent hole transporting capability, superior thermal stability, and can be vacuum deposited as thin film EL hole transport components.

These and other features of the present invention are accomplished in embodiments thereof by the provision of a layered organic EL devices comprised, for example, of an anode, a cathode, and therebetween the anode and the cathode an organic electroluminescent layer comprising a hole transporting layer containing an indolocarbazole compound, and an electron transporting layer, and which devices possess in embodiments a number of advantages including improved thermal stability, extended service life, high electroluminescence efficiency, superior hole and electron injecting and transporting characteristics, and which devices can be fabricated by vacuum deposition techniques. The EL devices of the present invention provide, for example, improved thermal and operational stability and excellent device durability at temperatures about equal to, or about above 45° C. (degrees Centigrade) such as from about 50° C. to about 95° C.

In embodiments, the present invention relates to organic EL devices that are comprised in sequence of an anode, a charge, especially hole transporting layer, an electron transporting layer, and a cathode, and wherein the transporting layer contains at least an indolocarbazole compound represented by the following Formulas (I) or (II); or optionally mixtures thereof

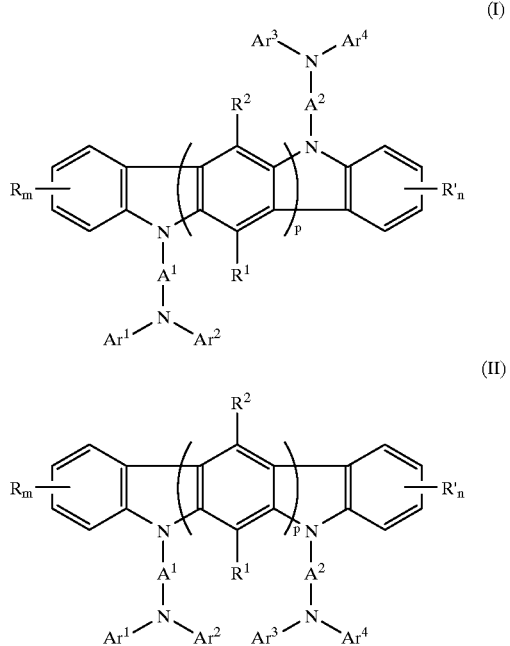

wherein R and R' are independently selected from the group consisting of hydrogen, halogen, alkyl with, for example, from 1 to about 25 carbon atoms, alkoxy with, for example, from about 1 to about 25 carbon atoms, aryl with, for example, from about 6 to about 30 carbon atoms, and fused aromatic rings such as benzo; m and n are preferably integers, or numbers of 0 to 4; $A^1$ and $A^2$ are arylene with, for example, from about 6, preferably 7, to about 31 carbon atoms, such as phenylene, tolylene, biphenylene, and the like; $Ar^1$, $Ar^2$, $Ar^3$, and $Ar^4$ are aryl, such as those aryl groups with, for example, from about 6 to about 30 carbon atoms independently selected from the group consisting of, for example, phenyl, tolyl, xylyl, chlorophenyl, alkoxyphenyl, naphthyl and the like; $R^1$ and $R^2$ are independently selected from the group consisting of hydrogen, halogen, alkyl with, for example, from 1 to about 25 carbon atoms, alkoxyl, or aryl; and p is preferably a number of from about 1 to 3.

In embodiments, the present invention relates to an organic electroluminescent (EL) device comprised of a charge transport component of an indolocarbazole compound represented by Formulas (I) or (II)

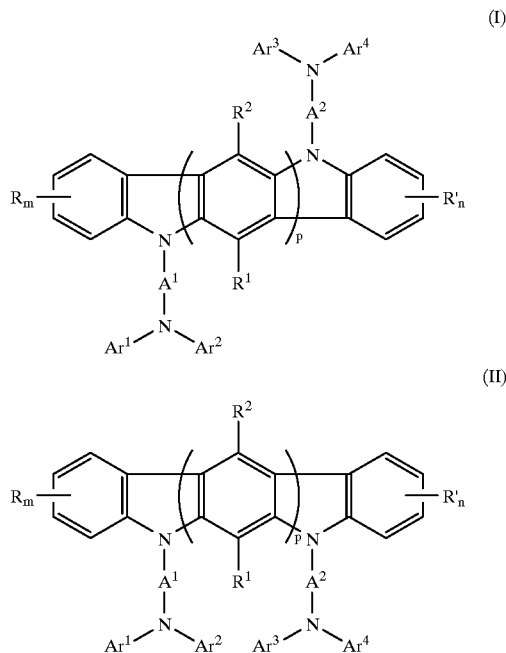

wherein R and R' are independently selected from the group consisting of hydrogen, alkyl, alkoxyl, aryl, and halogen; m and n are numbers; $A^1$ and $A^2$ are arylene; $Ar^1$, $Ar^2$, $Ar^3$, and $Ar^4$ are aryl; $R^1$ and $R^2$ are independently selected from the group consisting of hydrogen, alkyl, alkoxyl, aryl, and halogen; and p is a number; an EL device wherein R and R' are fused aromatic rings; an EL device wherein arylene contains from 6 to about 25 carbon atoms, alkyl contains from 1 to about 25 carbon atoms, alkoxy contains from 1 to about 25 carbon atoms, and aryl contains from 6 to about 30 carbon atoms; an EL device wherein arylene contains from 6 to about 12 carbon atoms, alkyl contains from 1 to about 12 carbon atoms, and aryl contains from 6 to about 18 carbon atoms; an EL device wherein $Ar^1$, $Ar^2$, $Ar^3$, and $Ar^4$ are aryl groups independently selected from the group consisting of phenyl, tolyl, xylyl, halophenyl, alkoxyphenyl, and naphthyl; an EL device wherein alkyl is methyl, ethyl, propyl, butyl, or pentyl; alkoxy is methoxy, ethoxy, propoxy, butoxy, or pentoxy; and arylene is phenylene or biphenylene; an EL device further including an anode and a cathode, and an organic electroluminescent element situated between the anode and cathode, and wherein said organic electroluminescent element comprises said indolocarbazole of Formulas (I) or (II); an EL device wherein p is from 1 to 3, and m and n are from zero to 4; an EL device wherein $Ar^1$, $Ar^2$, $Ar^3$, and $Ar^4$ are phenyl, tolyl, or xylyl, and wherein $R^1$ and $R^2$ are hydrogen; an EL device wherein R and R' are hydrogen or methyl; $A^1$ and $A^2$ are a phenylene, or a biphenylene; $Ar^1$, $Ar^2$, $Ar^3$, and $Ar^4$ are independently selected from the group consisting of phenyl, tolyl, and xylyl; $R^1$ and $R^2$ are hydrogen; m and n are zero to 4, and p is 1; an EL device wherein said indolocarbazole is selected from the group consisting of 5,11-bis[4'-(3- methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(diphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4'-(diphenylamino)-1,1'-biphenyl-4-yl]-2,8-dimethyl-5,11-dihydroindolo[3,2-b]carbazole, 5,11-bis[4-(diphenylamino)phenyl]-5,11-dihydroindolo[3,2-b]carbazole, 5,11-bis[4-(3-methyldiphenylamino)phenyl]-5,11-dihydroindolo[3,2-b]carbazole, and 5,11-bis[4-(4-methyldiphenylamino)phenyl]-5,11-dihydroindolo[3,2-b]carbazole; an EL device wherein said indolocarbazole compound is selected from the group consisting of 5,7-bis[4'-(3-methyldiphenylamino)-1,1'-biphenyl-4-yl]-5,7-dihydroindolo[2,3-b]carbazole, 5,7-bis[4'-(diphenylamino)-1,1'-biphenyl-4-yl]-5,7-dihydroindolo[2,3-b]carbazole, 5,7-bis[4-(diphenylamino)phenyl]-5,7-dihydroindolo[2,3-b]carbazole, and 5,7-bis[4-(3-methyldiphenylamino)phenyl]-5,7-dihydroindolo[2,3-b]carbazole; an EL device wherein p in Formula (I) or (II) is 1; an EL device wherein $A^1$ and $A^2$ are phenylene or biphenylene; an EL device wherein said indolocarbazole compound is selected from the group consisting of 5,11-bis[4'-(3-methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(diphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4'-(diphenylamino)-1,1'-biphenyl-4-yl]-2,8-dimethyl-5,11-dihydroindolo[3,2-b]carbazole, 5,11-bis[4-(diphenylamino)phenyl]-5,11-dihydroindolo[3,2-b]carbazole, 5,11-bis[4-(3-methyldiphenylamino)phenyl]-5,11-dihydroindolo[3,2-b]carbazole, and 5,11-bis[4-(4-methyldiphenylamino)phenyl]-5,11-dihydroindolo[3,2-b]carbazole; an EL device comprised of a supporting substrate, an anode, a hole transporting layer, an electron transporting layer, and a cathode, wherein said anode is of a thickness ranging from about 30 nanometers to about 100 nanometers, said hole transport layer contains at least one indolocarbazole compound of the Formulas (I) or (II) with a thickness ranging from about 10 nanometers to about 100 nanometers, said electron transporting layer is of a thickness ranging from about 10 nanometers to about 100 nanometers, and said cathode is of a thickness ranging from about 10 nanometers to about 200 nanometers; an EL device wherein said anode is indium tin oxide, and said cathode is a magnesium silver alloy or a lithium aluminum alloy; an EL device wherein said electron transporting layer is comprised of a metal chelate compound of 8-hydroxyquinoline; an EL device wherein said indolocarbazole is an indolocarbazole compound represented by the formula

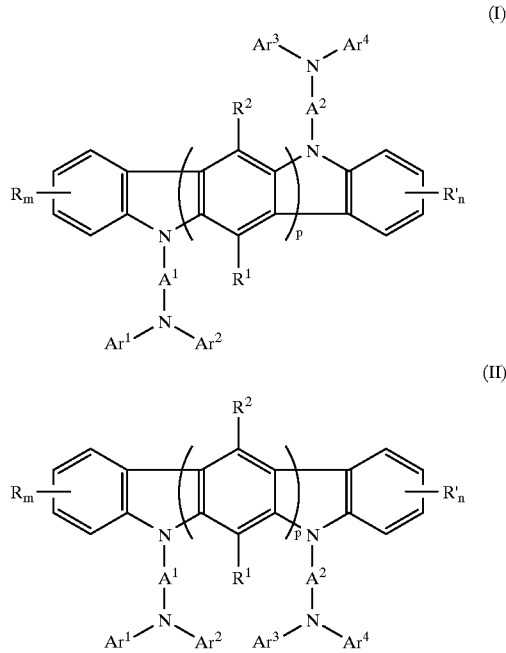

wherein R and R' are independently selected from the group consisting of hydrogen, alkyl, alkoxyl, aryl, and halogen; m and n are numbers of 0 to 4; $A^1$ and $A^2$ are arylene; $Ar^1$, $Ar^2$, $Ar^3$, and $Ar^4$ are aryl; $R^1$ and $R^2$ are independently selected from the group consisting of hydrogen, alkyl, alkoxyl, aryl, and halogen; and p is a number of from about 1 to about 3; an EL device wherein R and R' of compounds (I) and (II) are fused aromatic rings; an EL device wherein arylene of compounds (I) and (II) contains from 6 to about 25 carbon atoms, alkyl contains from 1 to about 25 carbon atoms, alkoxy contains from 1 to about 25 carbon atoms, and aryl contains from 6 to about 30 carbon atoms; an EL device wherein arylene contains from 6 to about 12 carbon atoms, alkyl contains from 1 to about 12 carbon atoms, and aryl contains from 6 to about 18 carbon atoms; an EL device wherein $Ar^1$, $Ar^2$, $Ar^3$, and $Ar^4$ of compounds (I) and (II) are aryl groups independently selected from the group consisting of phenyl, tolyl, xylyl, halophenyl, alkoxyphenyl, and naphthyl; and wherein alkyl is methyl, ethyl, propyl, butyl, or pentyl; alkoxy is methoxy, ethoxy, propoxy, butoxy, or pentoxy; and arylene is phenylene; an EL device wherein said indolocarbazole is 5,11-bis[4'-(3-methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4-(diphenylamino)phenyl]-5,11-dihydroindolo[3,2-b]carbazole, or 5,11-bis[4-(3-methyldiphenylamino)phenyl]-5,11-dihydroindolo[3,2-b]carbazole; an EL device wherein p is 1to 3, n is 0, 1, 2, 3, or 4, and a compound of Formula (I) is selected; and an EL device wherein p is 1to 3, n is 0, 1, 2, 3, or 4, and a compound of Formula (I) is selected.

DESCRIPTION OF EMBODIMENTS

Figure 1:
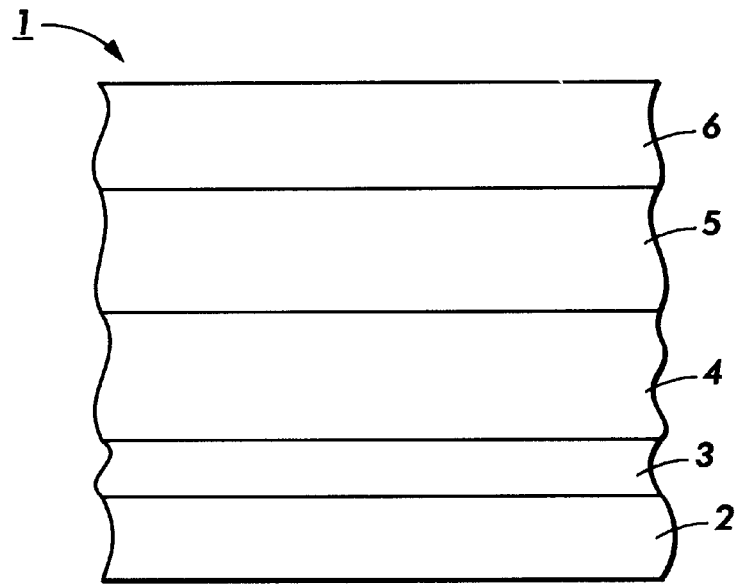
Figure 2:
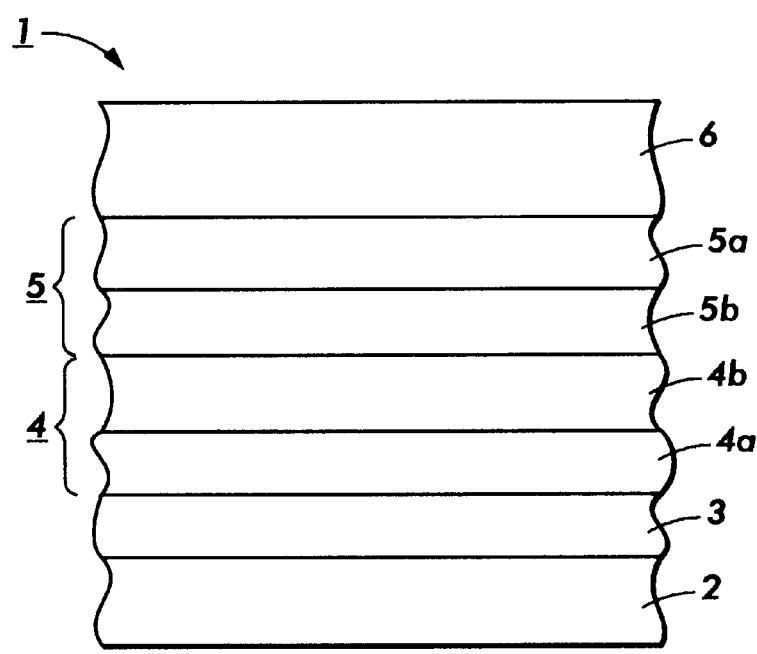

Embodiments of the present invention will be described in more details with reference to the schematic as depicted in FIG. 1 and FIG. 2.

FIG. 1 illustrates an EL device structure or an organic light emitting diode 1 comprised of a supporting substrate 2 of, for example, glass, an anode 3, an organic hole transporting layer 4 comprised of at least one of the indolocarbazoles of the formulas illustrated herein, and preferably indolocarbazoles of Formula (I), an organic electron transporting layer 5, and in contact therewith a low work function, for example from about 2.5 eV to about 4.0 eV, metal as a cathode 6. In this EL device, a junction is formed between the hole transporting zone and the electron transporting zone. In operation, when the anode is electrically biased to a positive potential with respect to the cathode, holes are injected into the organic hole transporting zone and transported across this zone to said junction. Concurrently, electrons are injected from the cathode into the electron transporting zone and are transported toward the same junction. The recombination of holes and electron occurs near the junction resulting in light emission.

In another embodiment as illustrated in FIG. 2, the light emitting diode, or EL device 1 is comprised of a supporting substrate 2 of, for example, glass, an anode 3, an organic hole transporting zone 4 comprised of layers 4a and 4b, an organic electron transporting zone comprised of layers 5a and 5b, and in contact therewith a low work function metal cathode 6. In this device structure, the transporting zone is comprised of one or more transport layers as compared to the single-layer transporting zone of the device structure of FIG. 1. Specifically, the hole transporting zone 4 of FIG. 2 is comprised of a layer 4a which facilitates hole injection, and a layer 4b which transports hole carriers. The electron transporting zone 5 is comprised of a layer 5a which facilitates electron injection, and a layer 5b which transports electrons. These layers 4a, 4b, 5a, and 5b are of various suitable thickness, for example from about 40 to about 100 nanometers in embodiments.

Illustrative examples of the supporting substrate include polymeric components, glass and the like, and more specifically, polyesters like MYLAR®, polycarbonates, polyacrylates, polymethacrylates, polysulfones, quartz, and the like. Other substrates can also be selected providing, for example, material selected can effectively support the other layers, and that it does not interfere with the device functional performance. The thickness of the substrate can be, for example, from about 25 to about 2,000 microns, and more specifically, from about 50 to about 1,000 microns, depending, for example, on the structural demands of the device.

Examples of the anode, which is contiguous to, and in contact with the substrate, include positive charge injecting electrodes, such as indium tin oxide, tin oxide, gold, platinum, or other suitable materials, such as electrically conductive carbon, conjugated polymers, such as polyaniline, polypyrrole, and the like, with a work function equal to, or greater than about 4, and more specifically, from about 4.0 to about 6.5 electron volts. The thickness of the anode can range from, for example, about 10 to 5,000 Å with the preferred range being dictated by the optical constants of the anode material. One preferred range of thickness is from about 20 to about 1,000 Angstroms.

The hole transporting layer 4 illustrated herein can be of a number of different convenient forms. For example, this layer may be comprised of one layer comprising one or more of hole transport components, at least one of which is an indolocarbazole compound. In another preferred form, layer 4 may be laminately formed from a layer 4a in contact with the anode, and which layer contains a component which facilitates hole injection, and a layer 4b containing the indolocarbazole hole transport component. Any suitable materials which can assist with hole injection from the anode may be employed in layer 4a, with the preferred materials being the porphyrin derivatives which are disclosed in U.S. Pat. No. 4,720,432, the disclosure of which is totally incorporated herein by reference. Representative examples of porphyrin derivatives thereof are porphyrin; 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like.

In embodiments, the hole transporting layer 4 contains at least one indolocarbazole compound as represented by Formula (I) or (II). The indolocarbazole compounds of the present invention generally contain a structurally rigid indolocarbazole nucleus, and offer a number of advantages as illustrated herein as they possess, for example, a high glass transition temperature, and are capable of forming thermally and morphologically stable thin films by vacuum evaporation techniques.

Specific examples of arylene groups, $A^1$ and $A^2$ in Formula (I) or (II) include those illustrated by Formulas A-1 through A-8, and their substituted derivatives with substituents being selected from, for example, the group consisting of alkyl with 1 to about 5 carbon atoms, phenyl, and aryl with a substituent of halogen atom, alkyl or alkoxy with 1 to 5 carbons, and the like.

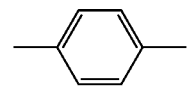

A-1

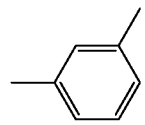

A-2

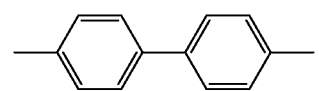

A-3

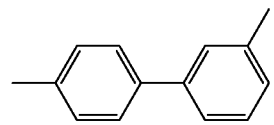

A-4

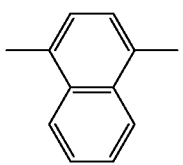

A-5

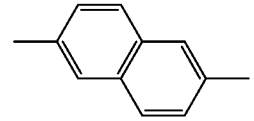

A-6

A-7

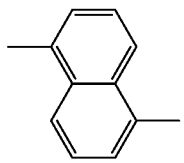

A-8

Illustrative examples of indolocarbazole compounds (I) and (II) which can be selected for use in the EL devices of the present invention are as follows, with 1, 2, 3, 4, 5, 6, 12, 13 and 17 being preferred in embodiments: 5,11-bis[4'-(3-methyldiphenylamino)-1,1'-biphenyl-4-yl]-5,11-dihydroindolo[3,2-b]carbazole; 5,11-bis[4'-(4-methyldiphenylamino)-1,1'-biphenyl-4-yl]-5,11-dihydroindolo[3,2-b]carbazole; 5,11-bis[4'-(diphenylamino)-1,1'-biphenyl-4-yl]-5,11-dihydroindolo[3,2-b]carbazole; 5,11-bis[4'-(di-p-tolylamino)-1,1'-biphenyl-4-yl]-5,11-dihydroindolo[3,2-b]carbazole; 5,11-bis[4'-(3,4-dimethyldiphenylamino)-1,1'-biphenyl-4-yl]-5,11-dihydroindolo[3,2-b]carbazole; 5,11-bis[4'-(3-methoxydiphenylamino)-1,1'-biphenyl-4-yl]-5,11-dihydroindolo[3,2-b]carbazole; 5,11-bis[4'-(3-chlorodiphenylamino)-1,1'-biphenyl-4-yl]-5,11-dihydroindolo[3,2-b]carbazole; 5,11-bis[4'-(4-chlorodiphenylamino)-1,1'-biphenyl-4-yl]-5,11-dihydroindolo[3,2-b]carbazole; 5,11-bis[4'-(diphenylamino)-1,1'-biphenyl-4-yl]-2,8-dimethyl-5,11-dihydroindolo[3,2-b]carbazole; 5,11-bis[4'-(4-methyldiphenylamino)-1,1'-biphenyl-4-yl]-2,8-dimethyl-5,11-dihydroindolo[3,2-b]carbazole; 5,11-bis[4-(diphenylamino)phenyl]-5,11-dihydroindolo[3,2-b]carbazole; 5,11-bis[4-(3-methyldiphenylamino)phenyl]-5,11-dihydroindolo[3,2-b]carbazole; 5,11-bis[4-(4-methyldiphenylamino)phenyl]-5,11-dihydroindolo[3,2-b]carbazole; 5,11-bis[4-(diphenylamino)phenyl]-2,8-dimethyl-5,11-dihydroindolo[3,2-b]carbazole; 5,11-bis[4-(4-methyldiphenylamino)phenyl]-2,8-dimethyl-5,11-dihydroindolo[3,2-b]carbazole; 5,11-bis[4-1-naphthylphenylamino)phenyl]-5,11-dihydroindolo[3,2-b]carbazole, and the like.

Those described by Formula (II) include 5,7-bis[4'-(3-methyldiphenylamino)-1,1'-biphenyl-4-yl]-5,7-dihydroindolo[2,3-b]carbazole; 5,7-bis[4'-(diphenylamino)-1,1'-biphenyl-4-yl]-5,7-dihydroindolo[2,3-b]carbazole; 5,7-bis[4'-(di-p-tolylamino)-1,1'-biphenyl-4-yl]-5,7-dihydroindolo[2,3-b]carbazole; 5,7-bis[4'-(3,4-dimethyldiphenylamino)-1,1'-biphenyl-4-yl]-5,7-dihydroindolo[2,3-b]carbazole; 5,7-bis[4'-(diphenylamino)-1,1'-biphenyl-4-yl]-2,10-dimethyl-5,7-dihydroindolo[2,3-b]carbazole; 5,7-bis[4-(diphenylamino)phenyl]-5,7-dihydroindolo[2,3-b]carbazole; 5,7-bis[4-(3-methyldiphenylamino)phenyl]-5,7-dihydroindolo[2,3-b]carbazole; 5,7-bis[4-(diphenylamino)phenyl]-2,10-dimethyl-5,7-dihydroindolo[2,3-b]carbazole; and the like.

(1)

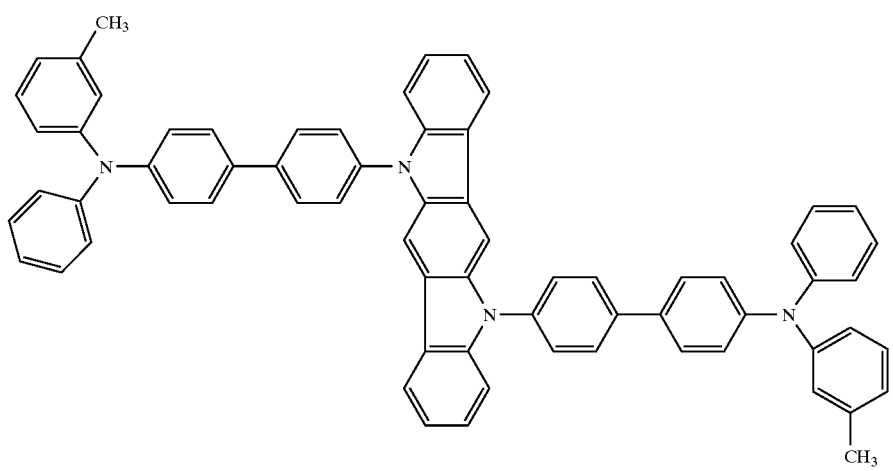

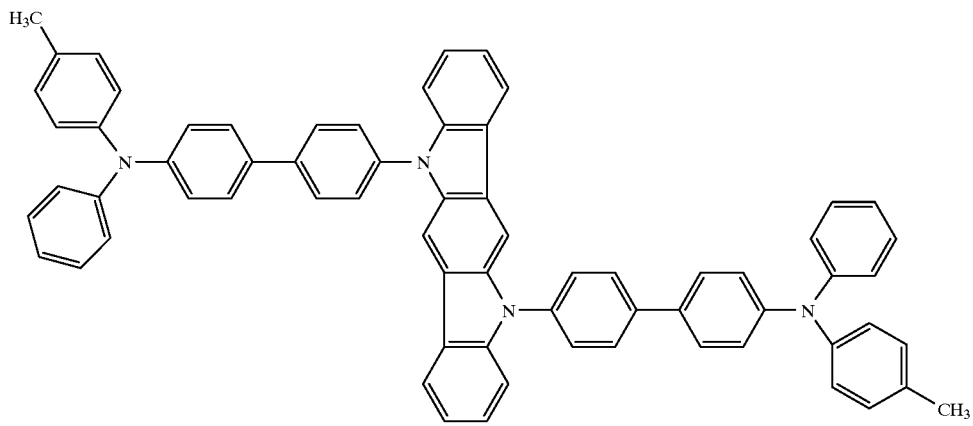
(2)
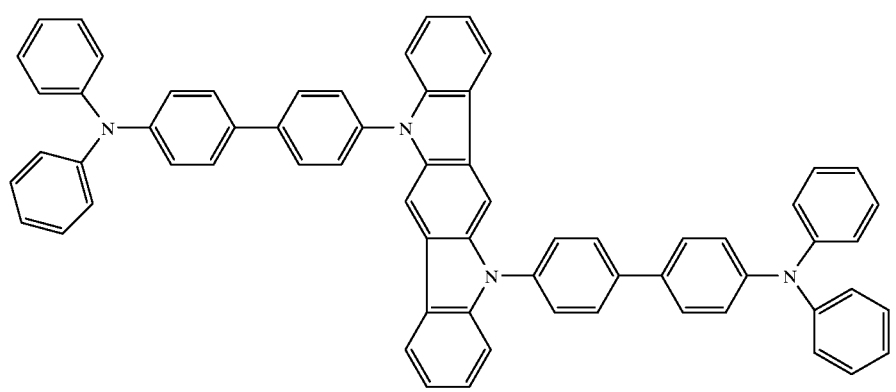
(3)
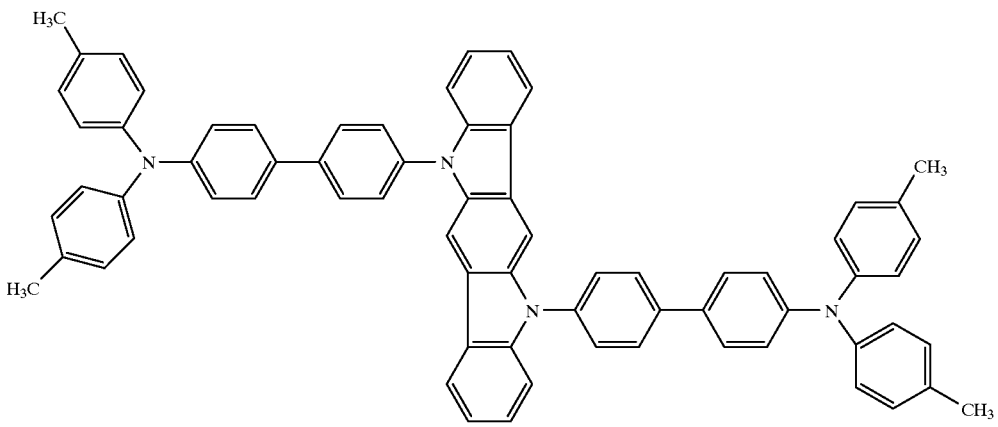
(4)

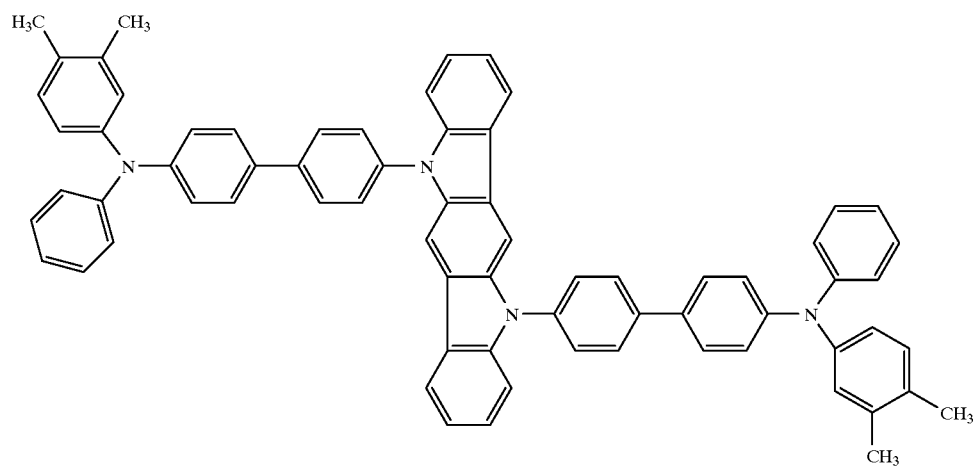
(5)
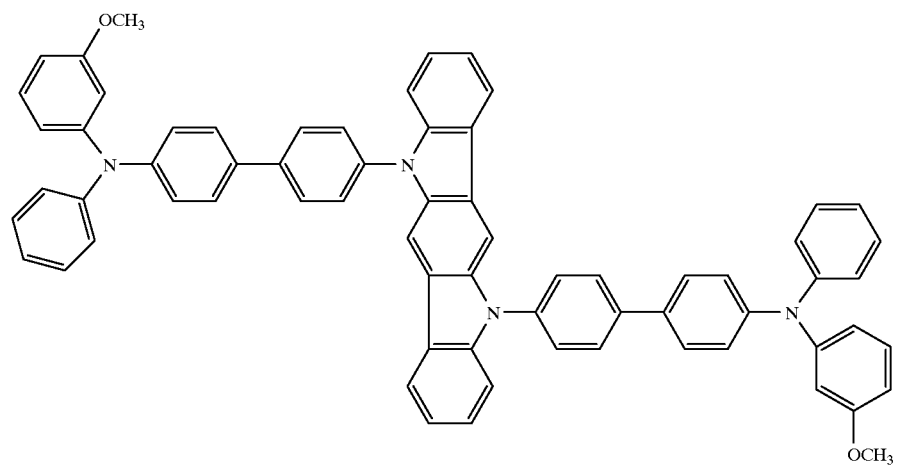
(6)
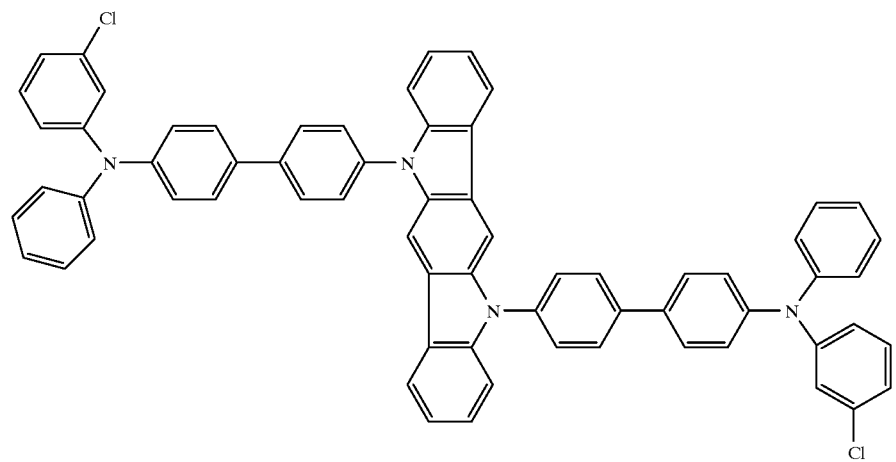
(7)

(8)
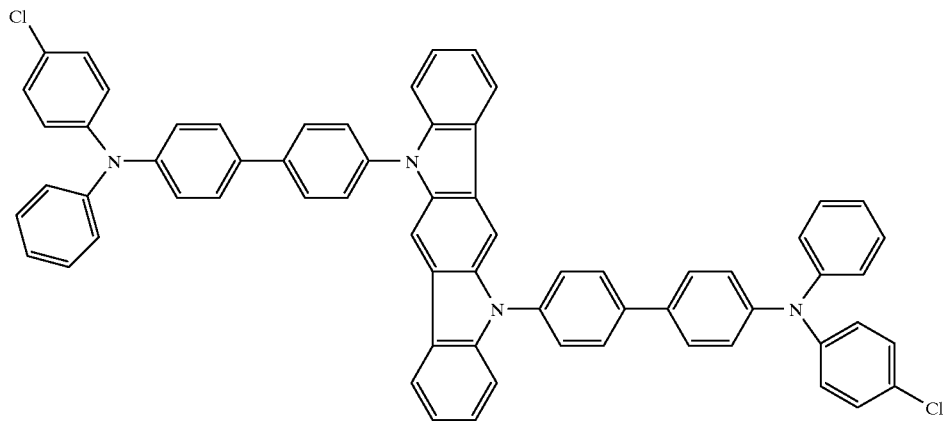
(9)
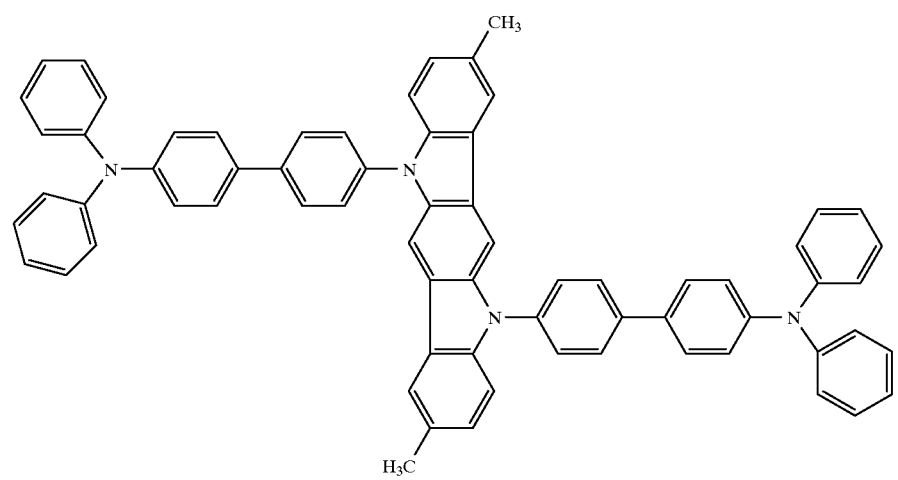
(10)
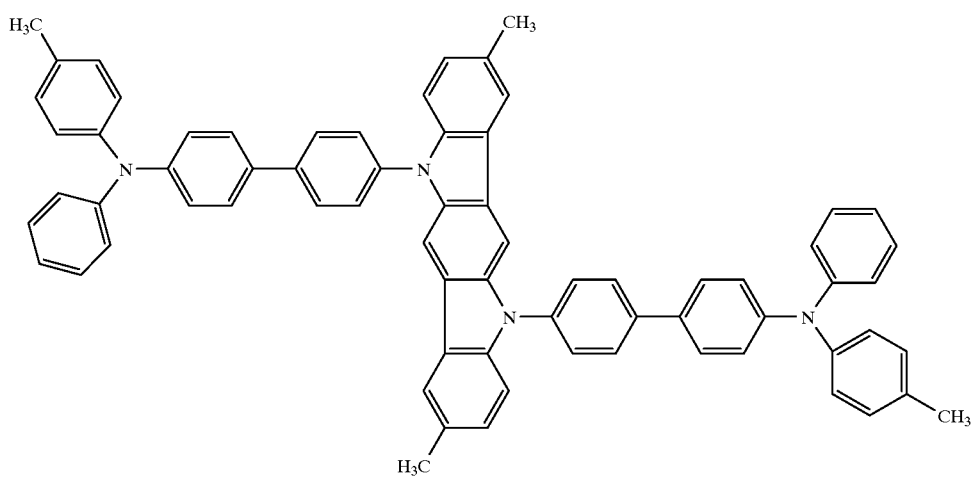

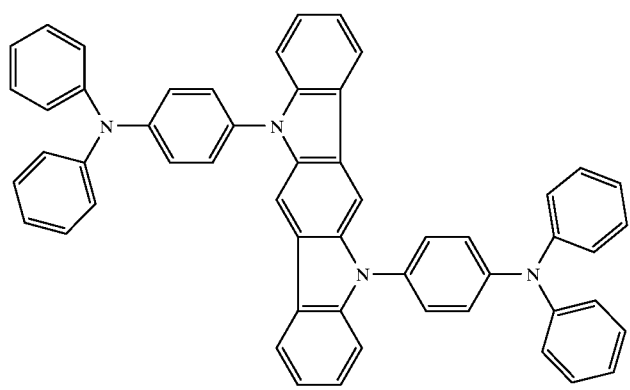
(11)
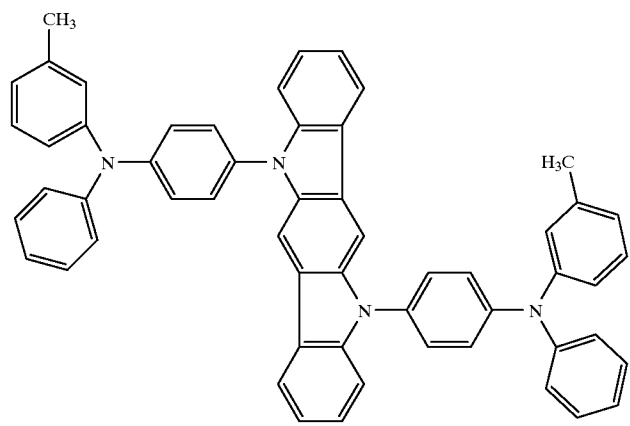
(12)
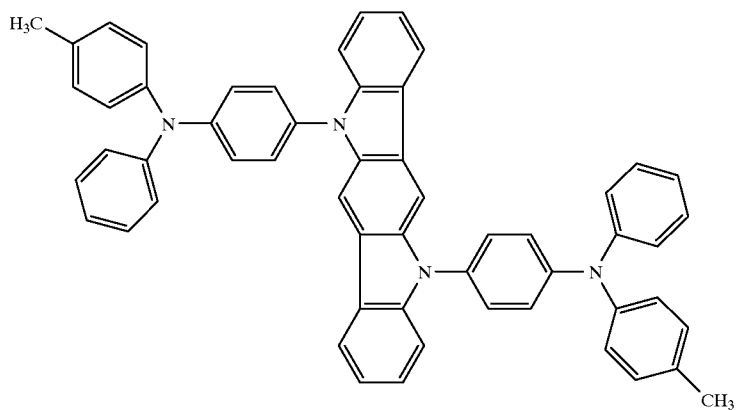
(13)

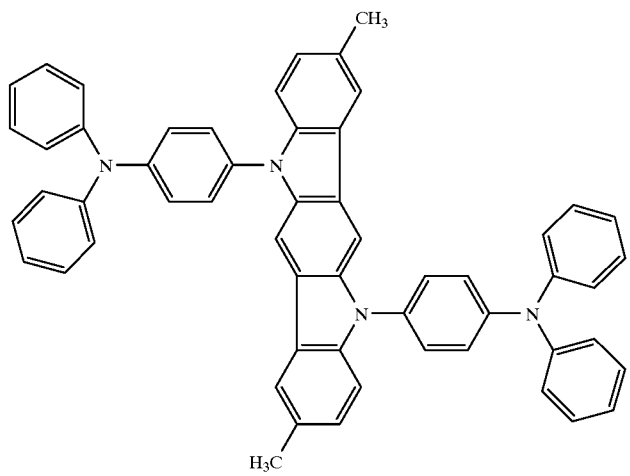
(14)
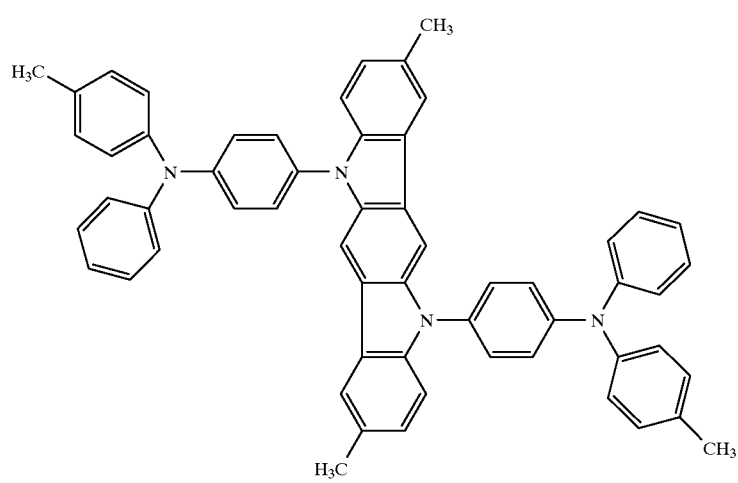
(15)
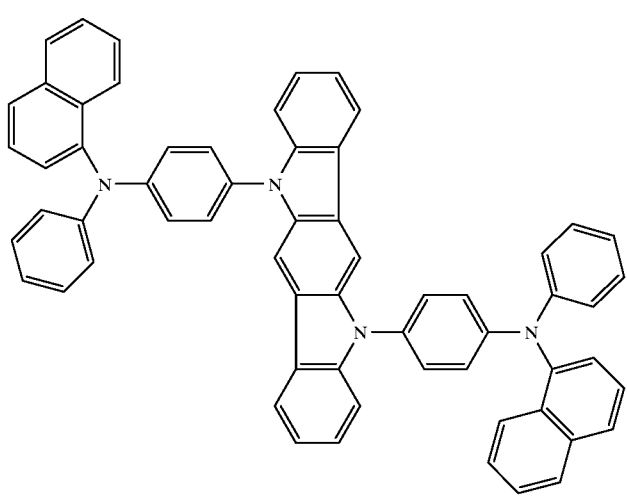
(16)

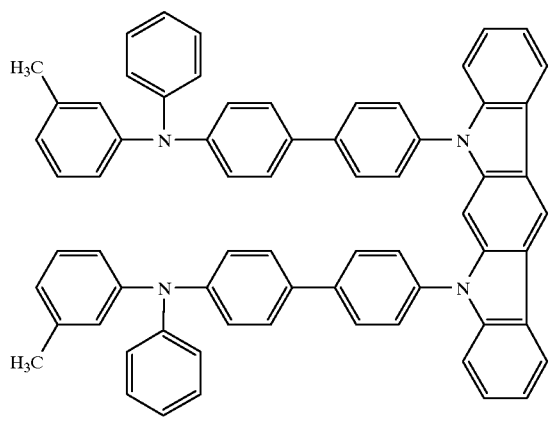
(17)
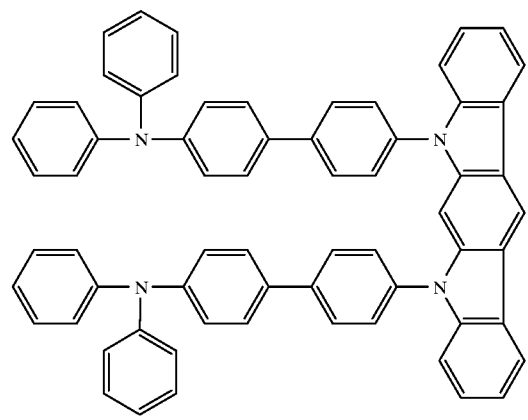
(18)
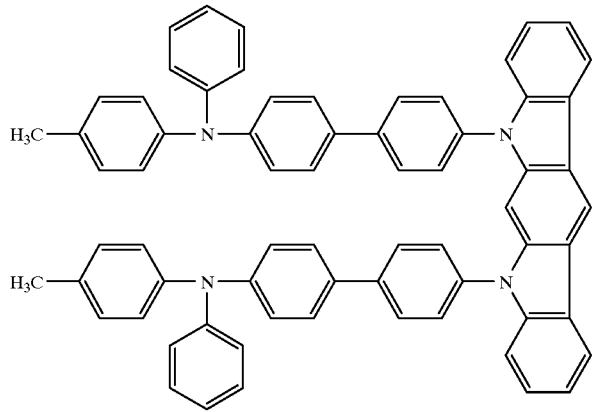
(19)

(20)
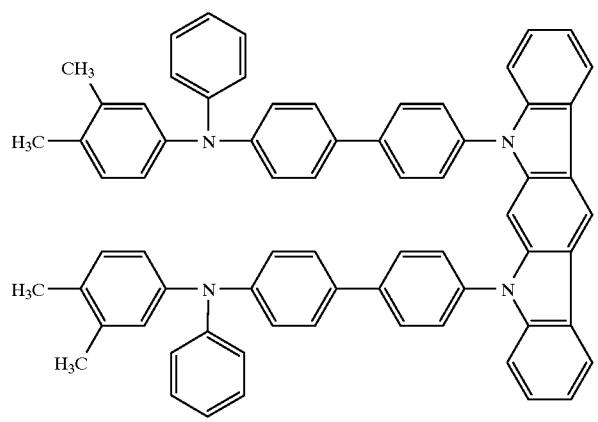
(21)
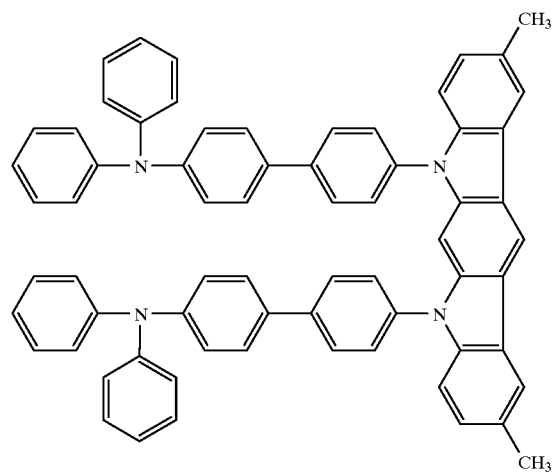
(22)
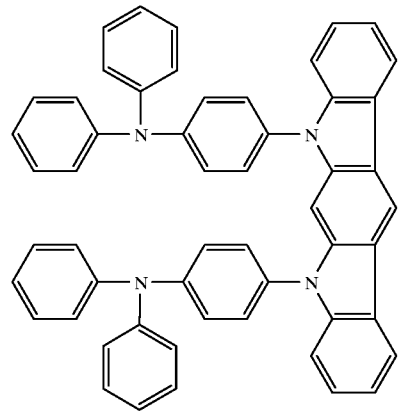

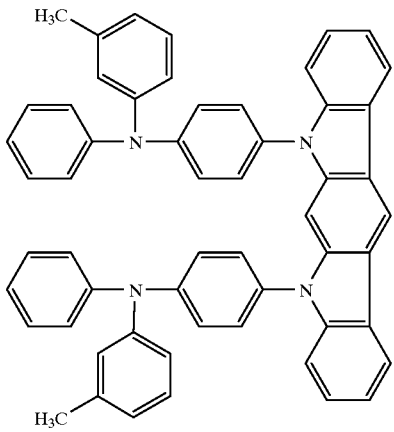

(23)

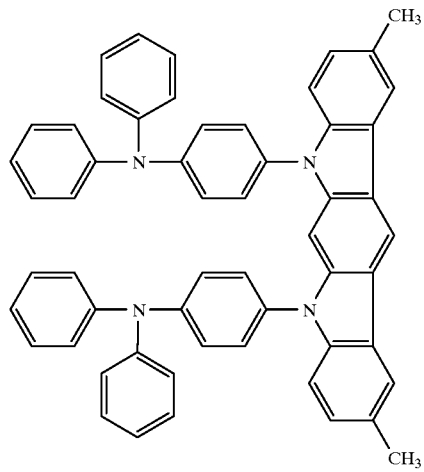

Similarly, the electron transporting layer or zone 5 may be of a number of different suitable, or convenient forms of, for example, a single layer or a dual-layer structure. Any suitable electron transport compounds may be utilized in this zone. Examples of useful electron transport compounds include fused ring luminescent materials, such as anthracene, phenanthracene, pyrene, perylene, and the like as illustrated in U.S. Pat. No. 3,172,862; butadienes such as 1,4-diphenylbutadiene and tetraphenylbutadiene, and stilbenes, and the like as illustrated in U.S. Pat. Nos. 4,356,429 and 5,516,577; optical brightness such as those disclosed by U.S. Pat. No. 4,539,507. The disclosures of each of these patent are totally incorporated herein by reference.

Preferred electron transport materials are metal chelates of 8-hydroxyquinoline as disclosed in U.S. Pat. Nos. 4,539,507; 5,151,629, and 5,150,006, the disclosures of which are totally incorporated herein by reference. Illustrative examples of the metal chelates include tris(8-hydroxyquinolinate)aluminum ($AlQ_3$), tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, bis(2-methylquinolinolato)aluminum-$\mu$-oxo-bis(2-methyl-8-quinolinolato)aluminum, bis(2-methyl-8-quinolinolato)(phenolato)aluminum, bis(2-methyl-8-quinolinolato)(paraphenylphenolato)aluminum, bis(2-methyl-8-quinolinolato)(2-naphthalolato)aluminum, and the like.

Another class of preferred electron transport materials are the metal chelates disclosed in copending application U.S. Ser. No. 829,398, the disclosure of which is totally incorporated herein by reference, and represented by the following formula $$L_n\text{-}M^{+n} \tag{III}$$

wherein M represents a metal, n is a number of from 1 to 3, and L is a ligand as represented by Formula (IV)

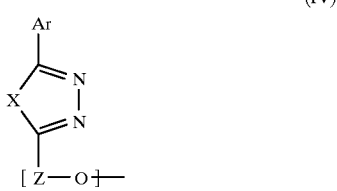

(IV)

wherein Ar is an aryl group containing, for example, 6 to about 30 carbon atoms or an aromatic heterocyclic group such as, for example, pyridyl, quinolyl, thienyl and the like; X is selected from the group consisting of oxygen, sulfur, and selenium; N is nitrogen, O is oxygen, and Z is an aromatic component, such as for example 1,2-phenylene, 1,2-naphthylene, 2,3-naphthylene, 3,4-pyridinediyl, 3,4-quinolinediyl, the substituted analogs thereof with the substituents being preferably alkyl containing 1 to about 5 carbon atoms, phenyl or aryl with a substituent of halogen, alkyl or alkoxy groups containing 1 to 5 carbons, halogen, alkoxy groups containing 1 to 3 carbon atoms, a carboxy group, a cyano group, and the like.

The metal ion of Formula (III) may be monovalent, divalent, or trivalent. Illustrative examples of metal ions include those which are, for example, capable of forming a stable chelate compound with the ligand, such as, for example, lithium, sodium, beryllium, magnesium, zinc, and the like, with the preferred metal ions being beryllium and zinc. Illustrative examples of metal chelate compounds (III) include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; is[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like.

In embodiments of the present invention, the total thickness of the luminescent medium, which includes the hole transporting zone 4 and the electron transporting zone 5, is preferably less than about 1 micron, and more specifically, from about 0.05 to about 1 micron, primarily to maintain a current density conducive to efficient light emission under a relatively low applied voltage across the electrodes. For instance, in the device of FIG. 1, suitable thicknesses of the hole transporting layer, or zone can range from about 40 to about 2,000 Å, with the preferred thickness being from about 100 to 800 Å, while the thickness of the electron transporting layer, or zone can range from about 50 to about 2,000 Å, with the preferred thickness being from about 100 to 800 Å. In the device of FIG. 2, the thickness of the hole injecting layer can range from about 25 to about 1,000 Å, with the preferred thickness being from about 50 to 800 Å, and the hole transporting layer thickness can range from about 25 to about 1,000 Å, with the preferred thickness being from about 50 to 800 Å. Similarly, the electron transporting layer can range in thickness of from about 25 to about 1,000 Å, with the preferred thickness being from about 50 to 800 Å, and the electron injecting layer thickness can range from about 25 to about 1000 Å, with the preferred thickness being from about 50 to 800 Å.

The cathode 6 can be comprised of any metal, including high or low work function metals. The cathode can be derived from a combination of a low work function metal, for example less than about 4 eV, such as from about 2 to about 4 eV and at least one other metal. Effective proportions of the low work function metal to the second metal are from less than about 0.1 percent to about 99.9 percent by weight. Illustrative examples of low work function metals include alkaline metals, such as lithium or sodium, Group 2A or alkaline earth metals, such as beryllium, magnesium, calcium, or barium, and Group III metals including rare earth metals and the actinide group metals, such as scandium, yettrium, lanthanium, cerium, europium, terbium, or actinium. Lithium, magnesium and calcium are the preferred low work function metals.

The thickness of cathode 6 ranges from, for example, about 10 to about 5,000 Å. The Mg:Ag cathodes, reference U.S. Pat. No. 4,885,211, constitute one preferred cathode construction. In embodiments, preferred cathode examples are as illustrated in U.S. Pat. No. 5,429,884, wherein the cathodes are formed from lithium alloys with other high work function metals such as aluminum and indium. The disclosure of each of these patents is totally incorporated herein by reference.

Both anode 3 and cathode 6 of the EL devices of the present invention can be of any convenient forms. A thin conductive layer can be coated onto a light transmissive substrate, for example a transparent or substantially transparent glass plate or plastic film. The EL device can include a light transmissive anode 3 formed from tin oxide or indium tin oxide coated on a glass plate. Also, very thin, for example less than 200 Å, light-transparent metallic anodes can be used, such as gold, palladium, and the like. In addition, a transparent or semitransparent thin layer of conductive carbon or conjugated polymers such as polyaniline, polypyrrole, and the like can be used as anodes. Additional suitable forms of the anode 3 and cathode 6 are illustrated in U.S. Pat. No. 4,720,432.

The indolocarbazole hole transport compounds can be prepared by Ullmann condensation of the corresponding dihydroindolocarbazole precursors selected from those represented by formulas (IBC) through (VIb) with aryl halide and a suitable known arylamine, such as a halo, like iodo alkylarylamino biphenyl in the presence of a copper catalyst, especially a ligand copper catalyst as illustrated in copending applications U.S. Ser. No. 791,694, U.S. Ser. No. 791,696, U.S. Ser. No. 790,669; and U.S. Pat. Nos. 5,538,829; 5,648,542; 5,654,482 and 5,648,539, the disclosures of each being totally incorporated herein by reference. Specific examples of dihydroindolocarbazoles, which can be readily obtained by known literature processes, are 5,11-dihydroindolo[3,2-b]carbazole, 5,7-dihydroindolo[2,3-b]carbazole, 5,12-dihydroindolo[3,2-c]carbazole, 5,10-dihydroindolo[3,2-a]carbazole, 11,12-dihydroindolo[2,3-a]carbazole, and the like.

Illustrative examples of aryl halides that can be utilized for the Ullmann condensation are iodobenzene, 3-iodotoluene, 4-iodotoluene, 4-iodo-1,2-xylene, 1-iodonaphthalene, 2-iodonaphthalene, 4-iodobiphenyl, 4-iodo-4'-(3-methyldiphenylamino)-1,1'-biphenyl, 4-iodo-4'-(diphenylamino)-1,1'-biphenyl, N,N-diphenyl-4-iodoaniline, N-phenyl-N-3-tolyl-4-iodoaniline, and the like. The Ullmann condensation is generally accomplished in an inert solvent, such as dodecane, tridecance, xylene, sulfolane, high boiling petroleum ethers with boiling point of, for example, over about 150° C., and the like, at a reaction temperature ranging from 90° C. to about 300° C., and preferably from 150° C. to 250° C. Any copper catalysts suitable for the Ullmann condensation, including copper powder, copper (I) oxide, copper (I) chloride, copper (II) sulfate, copper (II) acetate, and the like, may be employed for the process of the present invention, inclusive of the ligand copper catalysts as illustrated in the copending applications recited herein being preferred. An effective molar ratio of the copper catalyst to the dihydroindolocarbazole compound ranges, for example, from about 0.01 to about 0.5. The condensation reaction can be greatly accelerated with a base, such as for example an alkaline metal hydroxide or carbonate, including potassium hydroxide, potassium carbonate, sodium hydroxide, and the like. After the condensation, the reaction mixture is cooled down to about room temperature, and the product is isolated by known separation techniques such as, for example, by filtration and chromatography. The product is generally characterized by known analytical techniques such as IR and NMR.

The substituents, such as for example R and R', can be positioned at various different appropriate locations on the aromatic components, like the benzene ring.

The following Examples are provided to further define various species of the present invention, it being noted that these Examples are intended to illustrate and not limit the scope of the present invention. Comparative Examples and data are also provided.

EXAMPLE I

Synthesis of 5,11-bis[4'-(3-methyldiphenylamino)-1, 1'-biphenyl-4-yl]-5,11-dihydroindolo-[3,2-b] carbazole (1)

A 100 milliliter 3-necked round bottom flask equipped with a mechanical stirrer, reflux condenser, and argon inlet was purged with argon and then charged with 5,11-dihydroindolo[3,2-b]carbazole (1.65 grams, 6.45 mmol), 4-iodo-4'-(3-methyldiphenylamino)-1,1'-biphenyl (7.1 grams, 15.5 mmol), copper sulfate pentahydrate (0.12 gram, 0.5 mmol), potassium carbonate (2.1 grams, 15.2 mmol), and n-tridecane (5.0 milliliters). Under an argon atmosphere, the reaction mixture was then heated to about 250° C. with a heating mantle and allowed to proceed at that temperature until chromatographic analysis indicated that the reaction was complete after approximately 6 hours. The heating mantle was removed and the resulting mixture was cooled to 25° C. The solids were separated and washed with water, and collected by filtration. The crude product was chromatographed on alumina using hot toluene as an eluant to provide in a pure form, about 99.7 percent pure, the titled product. Yield: 3.45 grams. The glass transition temperature of this compound was 160° C. IR (Kbr): 1,598, 1,495, 1,450, 1,320, 1,291, 1,277, 1,232, 742, 695 cm$^{-1}$. $^1$H-NMR (DMSO-d$^6$-CDCl3): δ 2.30 (s), 6.88~7.51 (m), 7.66 (d, J=8.6 Hz), 7.76 (d, J=8.6 Hz), 7.93 (d, J=8.6 Hz), 7.99 (s), 8.17 (s), 8.19 (d, J=8.6 Hz).

EXAMPLE II

Synthesis of 5,11-bis[4-(3-methyldiphenylamino) phenyl]-5,11-dihydroindolo[3,2-b]carbazole (12)

A 100 milliliter 3-necked round bottom flask equipped with a mechanical stirrer, reflux condenser, and argon inlet was purged with argon and then charged with 5,11-dihydroindolo[3,2-b]carbazole (5.0 grams, 19.5 mmol), 4-(3-methyldiphenylamino)iodobenzene (15.5 grams, 40.54 mmol), copper sulfate pentahydrate (0.24 gram, 0.96 mmol), potassium carbonate (5.59 grams, 40.5 mmol), and n-tridecane (10.0 milliliters). Under an argon atmosphere, the reaction mixture was heated to about 250° C. with a heating mantle and allowed to proceed at that temperature until chromatographic analysis indicated that the reaction was complete after approximately 6 hours. The heating mantle was removed and the resulting mixture was cooled to 25° C. The solids were washed with water, and collected by filtration. The crude product was chromatographed on alumina using hot toluene as an eluant to provide in a pure form, about 99.7 percent pure, the titled product. Yield: 7.50 grams. The glass transition temperature of this compound was 125° C. IR (Kbr): 1,584, 1,510, 1,451, 1,311, 1,274, 1,230, 843, 759, 742, 692 cm$^{-1}$. $^1$H-NMR (DMSO-d$^6$-CDCl3): δ 2.34 (s), 6.93 (d, J=8.7 Hz), 7.02~7.52 (m), 7.82 (s), 8.09 (s), 8.17 (d, J=8.6 Hz).

EXAMPLE III

An organic EL was prepared as follows:

1. An indium tin oxide (ITO, 50 nanometers thickness) coated glass (1.0 millimeter thickness) was cleaned with a commercial detergent, rinsed with deionized water and dried in a vacuum over at 60° C. for 1 hour. Immediately before use, the glass was treated with UV ozone for 0.5 hour.

2. The ITO substrate was placed in a vacuum deposition chamber. The deposition rate and layer thickness were controlled by an Inficon Model IC/5 controller. Under a pressure of about 5×10$^{-6}$ torr the indolocarbazole compound 5,11-bis[4'-(3-methyldiphenylamino)-1,1'-biphenyl-4-yl]-5,11-dihydroindolo[3,2-b]carbazole obtained from Example I was evaporated from an electrically heated tantalum boat to deposit a 80 nanometer hole transporting layer on the ITO. The deposition rate of the indocarbazole compound was controlled at 0.6 nanometer/second.

3. Onto the indolocarbazole layer was deposited tris(8-hydroxyquinolinate)aluminum at an evaporation rate of 0.6 nanometer/second to form an 80 nanometer electron transporting layer which also acts as luminescent layer.

4. A 100 nanometer magnesium silver cathode alloy was deposited at a total deposition rate of 0.5 nanometer/second onto the electron injecting and transporting layer by simultaneous evaporation from two independently controlled tantalum boats containing Mg and Ag, respectively. The typical composition was 9:1 in atomic ratio of Mg to Ag. Finally, a 200 nanometer silver layer was overcoated on the Mg:Ag cathode for the purpose of protecting the reactive Mg from ambient moisture.

The device as prepared above was retained in a dry box which was continuously purged with nitrogen gas. Its performance was assessed by measuring its current-voltage characteristics and light output under a direct current measurement. The current-voltage characteristics were determined with a Keithley Model 238 High Current Source Measure Unit. The ITO electrode was always connected to the positive terminal of the current source. At the same time, the light output from the device was monitored by a silicon photodiode.

The performance characteristics of the above EL device were evaluated under a constant current density of 25 mA/cm$^2$. The EL device provided an initial light intensity of 590 cd/m$^2$ at 9.2 volts, a level which was well in excess of that required for display applications. The light intensity degraded slowly, with a 50 percent reduction after 350 hours of continuous operation. Furthermore, this device displayed no change in its current-light intensity characteristics even after it was subjected to a temperature of 60° C. for 72 hours.

COMPARATIVE EXAMPLE A

A comparative EL device was prepared in accordance with the procedure of Example III except that N,N'-bis(3-methylphenyl)-N,N'-diphenyl-4,4'-diaminobiphenyl, a triphenylamine-based hole transport molecule commonly selected for a number of prior art EL devices, was utilized in place of the 5,11-bis[4'-(3-methyldiphenylamino)-1,1'-biphenyl-4-yl]-5,11-dihydroindolo[3,2-b]carbazole. The performance characteristics of this device were evaluated in a similar manner. The device provided an initial light intensity of 570 cd/m$^2$ at an operating voltage of 9.5 volts as measured under a constant current density of 25 mA/cm$^2$. The light intensity degraded rapidly, and registered a 50 percent reduction after 90 hours of continuous operation. Furthermore, this device displayed substantial change in its current-light intensity characteristics after it was subjected to a temperature of 60° C. for 72 hours.

COMPARATIVE EXAMPLE B

Another comparative EL device was prepared in accordance with the procedure of Example III except that 1,1-bis(4-ditolylaminophenyl)cyclohexane was utilized in place of the 5,11-bis[4'-(3-methyldiphenylamino)-1,1'-biphenyl-4-yl]-5,11-dihydroindolo[3,2-b]carbazole. The performance characteristics of the device were evaluated in a similar manner. This device provided an initial light intensity of 450 cd/m$^2$ at an operating voltage of 11.5 volts. The light intensity degraded rapidly, and registered a 50 percent reduction after 60 hours of continuous operation.

EXAMPLE IV

An organic EL device was prepared in accordance with Example III except that an additional layer of copper phthalocyanine (15 nanometers) was first deposited on the ITO, and thereover was deposited the indolocarbazole layer to form a hole transporting zone. The device preparation was completed as described in Example III.

The EL performance characteristics were evaluated under a constant current density of 25 mA/cm$^2$. The device provided an initial light intensity of 520 cd/m$^2$ at 11.5 volts, a level which was well in excess of that required for display applications. The light intensity degraded slowly, with a 50 percent reduction after 450 hours of continuous operation.

EXAMPLE V

An organic EL device was fabricated in a similar manner as described in Example III. In place of the tris(8-hydroxyquinolinate)aluminum layer, and onto the indolocarbazole hole transporting layer was deposited an 80 nanometer electron transporting layer, also acting as a luminescent zone, through simultaneous evaporation of tris (8-hydroxyquinolinate)aluminum and a fluorescent material of N,N'-dimethyl-2,9-dimethylquinacridone from two independently controlled tantalum boats. The evaporation rates were controlled at 0.6 nanometer/second and 0.006 nanometer/second, respectively. The device preparation was completed by deposition of a Mg:Ag alloy as the cathode as described in Example III.

The EL performance characteristics were evaluated under a constant current density of 25 mA/cm$^2$. The device emitted a greenish yellow light with an initial light intensity of 950 cd/m$^2$ at 9.3 volts, a level which was well in excess of that required for display applications. The light intensity degraded slowly, with a 50 percent reduction after 530 hours of continuous operation.

EXAMPLE VI

An organic EL device was prepared in accordance with Example III except that 5,11-bis[4-(3-methyldiphenylamino)phenyl]-5,11-dihydroindolo[3,2-b]carbazole obtained from Example II was used as the hole transport component in place of 5,11-bis[4'-(3-methyldiphenylamino)-1,1'-biphenyl-4-yl]-5,11-dihydroindolo[3,2-b]carbazole. The device preparation was completed as described in Example III.

The EL performance characteristics of the above EL device were evaluated under a constant current density of 25 mA/cm$^2$. The device provided an initial light intensity of 560 cd/m$^2$ at 9.3 volts, a level which was well in excess of that required for display applications. The light intensity degraded slowly, with a 50 percent reduction after 420 hours of continuous operation.

Other modifications of the present invention will occur to those of ordinary skill in the art subsequent to a review of the present application. These modifications and equivalents thereof are intended to be included within the scope of the present invention.

What is claimed is:

1. An organic electroluminescent (EL) device comprised of an anode, a cathode and of a charge transport component of an indolocarbazole compound represented by Formulas (I) or (II)

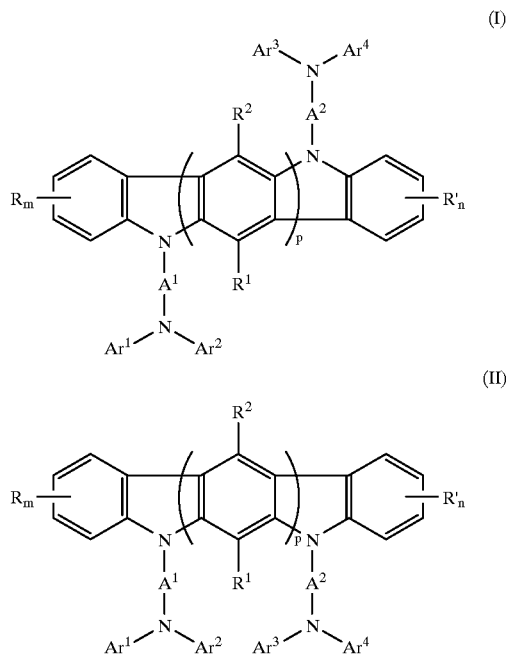

wherein R and R' are independently selected from the group consisting of hydrogen, alkyl, alkoxyl, aryl, and halogen; m and n are from 0 to 4; A$^1$ and A$^2$ are arylene; Ar$^1$, Ar$^2$, Ar$^3$, and Ar$^4$ are aryl; R$^1$ and R$^2$ are independently selected from the group consisting of hydrogen, alkyl, alkoxyl, aryl, and halogen; and p is a number from 1 to 3.

2. An EL device in accordance with claim 1 wherein R and R' are fused aromatic rings.

3. An EL device in accordance with claim 1 wherein arylene contains from 6 to about 25 carbon atoms, alkyl contains from 1 to about 25 carbon atoms, alkoxy contains from 1 to about 25 carbon atoms, and aryl contains from 6 to about 30 carbon atoms.

4. An EL device in accordance with claim 1 wherein arylene contains from 6 to about 12 carbon atoms, alkyl contains from 1 to about 12 carbon atoms, and aryl contains from 6 to about 18 carbon atoms.

5. An EL device in accordance with claim 1 wherein Ar$^1$, Ar$^2$, Ar$^3$, and Ar$^4$ are aryl groups independently selected from the group consisting of phenyl, tolyl, xylyl, halophenyl, alkoxyphenyl, and naphthyl.

6. An EL device in accordance with claim 1 wherein alkyl is methyl, ethyl, propyl, butyl, or pentyl; alkoxy is methoxy, ethoxy, propoxy, butoxy, or pentoxy; and arylene is phenylene or biphenylene.

7. An EL device in accordance with claim 1 wherein p is from 1 to 3, and m and n are from 0 to 4.

8. An EL device in accordance with claim 1 wherein Ar$^1$, Ar$^2$, Ar$^3$, and Ar$^4$ are phenyl, tolyl, or xylyl, and wherein R$^1$ and R$^2$ are hydrogen.

9. An EL device in accordance with claim 1 wherein R and R' are hydrogen or methyl; A$^1$ and A$^2$ are a phenylene, or a biphenylene; $Ar^1$, $Ar^2$, $Ar^3$, and $Ar^4$ are independently selected from the group consisting of phenyl, tolyl, and xylyl; $R^1$ and $R^2$ are hydrogen; m and n are 0 to 4, and p is 1.

10. An EL device in accordance with claim 1 wherein said indolocarbazole is selected from the group consisting of 5,11-bis[4'-(3-methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(diphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4'-(diphenylamino)-1,1'-biphenyl-4-yl]-2,8-dimethyl-5,11-dihydroindolo[3,2-b]carbazole, 5,11-bis[4-(diphenylamino)phenyl]-5,11-dihydroindolo[3,2-b]carbazole, 5,11-bis[4-(3-methyldiphenylamino)phenyl]-5,11-dihydroindolo[3,2-b]carbazole, and 5,11-bis[4-(4-methyldiphenylamino)phenyl]-5,11-dihydroindolo[3,2-b]carbazole.

11. An EL device in accordance with claim 1 wherein said indolocarbazole compound is selected from the group consisting of 5,7-bis[4'-(3-methyldiphenylamino)-1,1'-biphenyl-4-yl]-5,7-dihydroindolo[2,3-b]carbazole, 5,7-bis[4'-(diphenylamino)-1,1'-biphenyl-4-yl]-5,7-dihydroindolo[2,3-b]carbazole, 5,7-bis[4-(diphenylamino)phenyl]-5,7-dihydroindolo[2,3-b]carbazole, and 5,7-bis[4-(3-methyldiphenylamino)phenyl]-5,7-dihydroindolo[2,3-b]carbazole.

12. An EL device in accordance with claim 1 wherein p in Formula (I) or (II) is 1.

13. An EL device in accordance with claim 1 wherein $A^1$ and $A^2$ are phenylene or biphenylene.

14. An EL device in accordance with claim 1 wherein said indolocarbazole compound is selected from the group consisting of 5,11-bis[4'-(3-methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(diphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4'-(diphenylamino)-1,1'-biphenyl-4-yl]-2,8-dimethyl-5,11-dihydroindolo[3,2-b]carbazole, 5,11-bis[4-(diphenylamino)phenyl]-5,11-dihydroindolo[3,2-b]carbazole, 5,11-bis[4-(3-methyldiphenylamino)phenyl]-5,11-dihydroindolo[3,2-b]carbazole, and 5,11-bis[4-(4-methyldiphenylamino)phenyl]-5,11-dihydroindolo[3,2-b]carbazole.

15. An EL device in accordance with claim 1 further comprised of a supporting substrate, a hole transporting layer and an electron transporting layer wherein said anode is of a thickness ranging from about 30 nanometers to about 100 nanometers, said hole transport layer contains at least one indolocarbazole compound of the Formulas (I) or (II) with a thickness ranging from about 10 nanometers to about 100 nanometers, said electron transporting layer is of a thickness ranging from about 10 nanometers to about 100 nanometers, and said cathode is of a thickness ranging from about 10 nanometers to about 200 nanometers.

16. An EL device in accordance with claim 15 wherein said anode is indium tin oxide, and said cathode is a magnesium silver alloy or a lithium aluminum alloy.

17. An EL device in accordance with claim 15 wherein said electron transporting layer is comprised of a metal chelate compound of 8-hydroxyquinoline.

18. An EL device in accordance with claim 15 wherein R and R' of compounds (I) and (II) are fused aromatic rings.

19. An EL device in accordance with claim 15 wherein arylene of compounds (I) and (II) contains from 6 to about 25 carbon atoms, alkyl contains from 1 to about 25 carbon atoms, alkoxy contains from 1 to about 25 carbon atoms, and aryl contains from 6 to about 30 carbon atoms.

20. An EL device in accordance with claim 15 wherein arylene contains from 6 to about 12 carbon atoms, alkyl contains from 1 to about 12 carbon atoms, and aryl contains from 6 to about 18 carbon atoms.

21. An EL device in accordance with claim 15 wherein $Ar^1$, $Ar^2$, $Ar^3$, and $Ar^4$ of compounds (I) and (II) are aryl groups independently selected from the group consisting of phenyl, tolyl, xylyl, halophenyl, alkoxyphenyl, and naphthyl; and wherein alkyl is methyl, ethyl, propyl, butyl, or pentyl; alkoxy is methoxy, ethoxy, propoxy, butoxy, or pentoxy; and arylene is phenylene.

22. An EL device in accordance with claim 15 wherein said indolocarbazole is 5,11-bis[4'-(3-methyldiphenylamino)-1,1'-biphenyl-4-yl]-5,11-dihydroindolo[3,2-b]carbazole, 5,11-bis[4'-(4-methyldiphenylamino)-1,1'-biphenyl-4-yl]-5,11-dihydroindolo[3,2-b]carbazole, 5,11-bis[4'-(3-methoxydiphenylamino)-1,1'-biphenyl-4-yl]-5,11-dihydroindolo[3,2-b]carbazole, 5,11-bis[4-(diphenylamino)phenyl]-5,11-dihydroindolo[3,2-b]carbazole, or 5,11-bis[4-(3-methyldiphenylamino)phenyl]-5,11-dihydroindolo[3,2-b]carbazole.

23. An EL device in accordance with claim 1 wherein p is 1 to 3, n is 0, 1, 2, 3, or 4, and a compound of Formula (I) is selected.

24. An EL device in accordance with claim 1 wherein p is 1 to 3, n is 0, 1, 2, 3, or 4, and a compound of Formula (II) is selected.

* * * * *